(12) United States Patent
Chen et al.

(10) Patent No.: US 7,035,145 B2
(45) Date of Patent: Apr. 25, 2006

(54) PROGRAMMING METHODS FOR MULTI-LEVEL FLASH EEPROMS

(75) Inventors: Chun Chen, Boise, ID (US); Kirk D. Prall, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/998,697

(22) Filed: Nov. 29, 2004

(65) Prior Publication Data

US 2005/0078529 A1    Apr. 14, 2005

Related U.S. Application Data

(60) Continuation of application No. 10/324,653, filed on Dec. 18, 2002, now Pat. No. 6,845,039, which is a division of application No. 09/920,866, filed on Aug. 2, 2001, now Pat. No. 6,522,584.

(51) Int. Cl.
G11C 16/04        (2006.01)

(52) U.S. Cl. .......................... 365/185.18; 365/185.14; 365/185.19; 365/185.24; 365/185.22; 365/185.28; 365/185.03

(58) Field of Classification Search ........... 365/185.18, 365/185.14, 185.19, 185.24, 185.22, 185.28, 365/185.03
See application file for complete search history.

(56) References Cited

U.S. PATENT DOCUMENTS

| | | | |
|---|---|---|---|
| 5,043,940 A | 8/1991 | Harari | |
| 5,293,560 A | 3/1994 | Harari | |
| 5,305,262 A | 4/1994 | Yoneda | |
| 5,418,743 A | 5/1995 | Tomioka et al. | |
| 5,424,978 A | 6/1995 | Wada et al. | |
| 5,440,505 A | 8/1995 | Fazio et al. | |
| 5,477,485 A | 12/1995 | Bergemont et al. | |
| 5,487,033 A * | 1/1996 | Keeney et al. | ......... 365/185.19 |

(Continued)

FOREIGN PATENT DOCUMENTS

JP            04351216            7/1992

OTHER PUBLICATIONS

Esseni, David, et al., *A New and Flexible Scheme for Hot-Electron Programming of Nonvolatile Memory Cells,* IEEE Transactions on Electron Devices, vol. 46, No. 1, Jan. 1999, pp. 125-133.

(Continued)

*Primary Examiner*—Viet Q. Nguyen
(74) *Attorney, Agent, or Firm*—Knobbe, Martens, Olson & Bear, LLP

(57) ABSTRACT

A method is provided for programming a memory cell of an electrically erasable programmable read only memory. The memory cell is fabricated on a substrate and comprises a source region, a drain region, a floating gate, and a control gate. The memory cell has a threshold voltage selectively configurable into one of at least three programming states. The method includes generating a drain current between the drain region and the source region by applying a drain-to-source bias voltage between the drain region and the source region. The method further includes injecting hot electrons from the drain current to the floating gate by applying a gate voltage to the control gate. A selected threshold voltage for the memory cell corresponding to a selected one of the programming states is generated by applying a selected constant drain-to-source bias voltage and a selected gate voltage.

16 Claims, 7 Drawing Sheets

U.S. PATENT DOCUMENTS

| | | | |
|---|---|---|---|
| 5,511,021 A | 4/1996 | Bergemont et al. | |
| 5,553,020 A * | 9/1996 | Keeney et al. | 365/185.19 |
| 5,557,567 A | 9/1996 | Bergemont et al. | |
| 5,587,949 A | 12/1996 | Bergemont et al. | |
| 5,594,685 A | 1/1997 | Bergemont et al. | |
| 5,708,600 A | 1/1998 | Hakozaki et al. | |
| 5,745,412 A | 4/1998 | Choi | |
| 5,751,635 A * | 5/1998 | Wong et al. | 365/185.19 |
| 5,805,499 A * | 9/1998 | Haddad | 365/185.19 |
| 5,808,937 A | 9/1998 | Chi et al. | |
| 5,818,757 A | 10/1998 | So et al. | |
| 5,818,761 A | 10/1998 | Onakado et al. | |
| 5,831,901 A | 11/1998 | Tang et al. | |
| 5,870,334 A * | 2/1999 | Hemink et al. | 365/185.17 |
| 5,892,710 A | 4/1999 | Fazio et al. | |
| 5,912,488 A | 6/1999 | Kim et al. | |
| 5,923,585 A | 7/1999 | Wong et al. | |
| 5,949,714 A * | 9/1999 | Hemink et al. | 365/185.17 |
| 5,959,896 A | 9/1999 | Forbes | |
| 6,011,722 A | 1/2000 | Bude et al. | |
| 6,091,631 A | 7/2000 | Kucera et al. | |
| 6,097,632 A * | 8/2000 | Roohparvar | 365/185.19 |
| 6,166,955 A | 12/2000 | Lu et al. | |
| 6,172,908 B1 * | 1/2001 | Cappelletti et al. | 365/185.19 |
| 6,212,100 B1 | 4/2001 | Choi | |
| 6,222,770 B1 * | 4/2001 | Roohparvar | 365/185.19 |
| 6,233,175 B1 | 5/2001 | Wang et al. | |
| 6,240,021 B1 | 5/2001 | Mori | |
| 6,243,292 B1 | 6/2001 | Kobayashi et al. | |
| 6,243,298 B1 | 6/2001 | Lee et al. | |
| 6,272,047 B1 * | 8/2001 | Mihnea et al. | 365/185.18 |
| 6,275,415 B1 * | 8/2001 | Haddad et al. | 365/185.11 |
| 6,314,025 B1 * | 11/2001 | Wong | 365/185.22 |
| 6,493,262 B1 | 12/2002 | Wald et al. | |
| 6,522,584 B1 | 2/2003 | Chen et al. | |
| 6,845,039 B1 * | 1/2005 | Chen et al. | 365/185.03 |
| 2001/0004325 A1 | 6/2001 | Choi | |

OTHER PUBLICATIONS

Esseni, David, et al., *Trading-Off Programming Speed and Current Absorption in Flash Memories with the Ramped-Gate Programming Technique*, IEEE Transactions on Electron Devices, vol. 47, No. 4, Apr. 2000, pp. 828-834.

Hu, C.-Y., et al., *Substrate-Current-Induced Hot Electron (SCIHE) injection: a new convergence scheme for flash memory*, IEEE, IEDM Tech. Dig., 1995, pp. 283-286.

Riccò, Bruno, et al., *Nonvolatile Multilevel Memories for Digital Applications*, Proceedings of the IEEE, vol. 86, No. 12, Dec. 1998, pp. 2399-2421.

* cited by examiner

PROGRAMMING METHODS FOR MULTI-LEVEL FLASH EEPROMS

CLAIM OF PRIORITY

This application is a continuation application of, and claims priority to, application Ser. No. 10/324,653, filed Dec. 18, 2002 now U.S. Pat. No. 6,845,039, which is incorporated in its entirety by reference herein and which is a divisional application of, and claims priority to U.S. patent application Ser. No. 09/920,866, filed Aug. 2, 2001 (now U.S. Pat. No. 6,522,584, issued Feb. 18, 2003), which is incorporated in its entirety by reference herein.

CROSS-REFERENCE TO RELATED CO-PENDING APPLICATION

This application is related to U.S. patent application Ser. No. 10/999,030, filed on Nov. 29, 2004, which is incorporated in its entirety by reference herein.

BACKGROUND OF THE INVENTION

1. Field of the Invention

The present invention generally relates to electrically reprogrammable nonvolatile memory devices and methods of utilizing the same. More particularly, the invention relates to processes and structures for programming erasable programmable read-only memories (EEPROMs).

2. Description of the Related Art

Memory devices such as erasable programmable read-only memories (EPROMs), electrically erasable programmable read-only memories (EEPROMs), or flash erasable programmable read-only memories (FEPROMs) are erasable and reusable memory cells which are often used in digital cellular phones, digital cameras, LAN switches, cards for notebook computers, etc. A memory cell operates by storing electric charge (representing either a binary "1" or "0" state of one data bit) on an electrically isolated floating gate, which is incorporated into a transistor. This stored charge affects the threshold voltage ($V_T$) of the transistor, thereby providing a way to read the memory element. It is therefore crucial that the memory cell be able to maintain the stored charge over time, so that charge leakage does not cause data errors by converting the data bit from one binary state to another.

A memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of an insulating oxide, and more particularly, silicon oxide. This dielectric layer is often referred to as a "tunnel oxide" layer, and is typically approximately 100 Å thick. Properties of the tunnel oxide layer must be strictly controlled to ensure the ability to read and write by transferring electrons across the tunnel oxide layer, while avoiding data loss through charge trapping or leakage. The control gate is positioned above the floating gate, and is electrically isolated from the floating gate by a storage dielectric layer, such as oxide-nitride-oxide (ONO). Electrical access to the floating gate is therefore only through capacitors.

A programmed memory cell has its $V_T$ increased by increasing the amount of negative charge stored on the floating gate, i.e., for given source and drain voltages, the control gate voltage which allows a current to flow between the source and the drain of a programmed memory cell is higher than that of a non-programmed memory cell. Therefore, the state of a memory cell is read by applying a control gate voltage below the predetermined level corresponding to the programmed state, but sufficiently high to allow a current between the source and the drain in a non-programmed memory cell. If a current is detected, then the memory cell is read to be not programmed.

One method to erase a memory cell (i.e., return the cell to its non-programmed state) is by exposing the floating gate to ultraviolet light, which excites the stored electrons out of the floating gate. The erasure of an EEPROM or FEPROM cell can also be accomplished via Fowler-Nordheim tunneling of charge from the floating gate, across the tunnel oxide, to the substrate, thereby reducing the stored charge in the floating gate. Under this mechanism for discharging the floating gate, for example, a large negative voltage (e.g., −10 V) is applied to the control gate, and a positive voltage (e.g., 5–6 V) is applied to the source while the drain is left floating. Electrons then tunnel from the floating gate through the tunnel oxide, and are accelerated into the source.

In an attempt to increase the storage density of an array of memory cells, efforts have been made to utilize multilevel memory cells, which are capable of representing more than two states by specifying more than one predetermined $V_T$ level. In such multilevel memory cells, each range of levels defined by the predetermined $V_T$ levels corresponds to a separate state. Therefore, to reliably distinguish between the various states, the multilevel memory cells must be programmed with narrow $V_T$ distributions within the ranges defined by the predetermined $V_T$ levels. Traditionally, these narrow $V_T$ distributions have been achieved using short programming pulses interleaved with verification read pulses in order to closely monitor the programmed level of a given cell. Examples of such multilevel memory cell programming are disclosed by Kucera, et al., U.S. Pat. No. 6,091,631; Fazio, et al., U.S. Pat. No. 5,892,710; and Harari, U.S. Pat. No. 5,293,560.

Such use of verification steps has two potential drawbacks. First, the circuitry needed to confirm that a particular cell has been properly programmed takes up valuable space on the semiconductor die. Second, the frequent verification steps take a substantial amount of time, thereby prolonging the programming process.

SUMMARY OF THE INVENTION

By eliminating the verification steps, the present invention achieves faster multi-level programming of flash memory devices. In accordance with one aspect of the present invention, a method is provided for programming a memory cell of an electrically erasable programmable read only memory. The memory cell is fabricated on a substrate and comprises a source region, a drain region, a floating gate, and a control gate. The memory cell has a threshold voltage selectively configurable into one of at least three programming states. The method comprises generating a drain current between the drain region and the source region by applying a drain-to-source bias voltage between the drain region and the source region. The method further comprises injecting hot electrons from the drain current to the floating gate by applying a gate voltage to the control gate. A selected threshold voltage for the memory cell corresponding to a selected one of the programming states is generated by applying a selected constant drain-to-source bias voltage.

In accordance with another aspect of the present invention, a method is provided for programming a memory cell of an electrically erasable programmable read only memory. The memory cell is fabricated on a substrate and comprises a source region, a drain region, a floating gate, and a control gate. The memory cell has a threshold voltage selectively configurable into one of at least three programming states. The method comprises generating a drain current between the drain region and the source region by applying a drain-to-source bias voltage between the drain region and the source region. The drain-to-source bias voltage comprises at least one voltage pulse. The method further comprises injecting hot electrons from the drain current to the floating gate by applying a gate voltage to the control gate. A selected threshold voltage for the memory cell corresponding to a selected one of the programming states is generated by applying a selected drain-to-source bias voltage.

In accordance with yet another aspect of the present invention, a method is provided for programming a memory cell of an electrically erasable programmable read only memory. The memory cell is fabricated on a substrate and comprises a source region, a drain region, a floating gate, and a control gate. The memory cell has a threshold voltage selectively configurable into one of at least three programming states. The method comprises generating a drain current between the drain region and the source region by applying a drain-to-source bias voltage between the drain region and the source region. The drain-to-source bias voltage comprises at least one voltage pulse. The method further comprises injecting hot electrons from the drain current to the floating gate by applying a gate voltage to the control gate. A selected threshold voltage for the memory cell corresponding to a selected one of the programming states is generated by applying a selected gate voltage.

In accordance with yet another aspect of the present invention, a method is provided for programming a memory cell of an electrically erasable programmable read only memory. The memory cell is fabricated on a substrate and comprises a source region, a drain region, a floating gate, and a control gate. The memory cell has a threshold voltage selectively configurable into one of at least three programming states. The method comprises generating a drain current between the drain region and the source region by applying a drain-to-source bias voltage between the drain region and the source region. The method further comprises injecting hot electrons from the drain current to the floating gate by applying a gate voltage to the control gate. The gate voltage comprises at least one voltage pulse. A selected threshold voltage for the memory cell corresponding to a selected one of the programming states is generated by applying a selected gate voltage.

In accordance with yet another aspect of the present invention, a method is provided for programming a memory cell of an electrically erasable programmable read only memory. The memory cell is fabricated on a substrate and comprises a source region, a drain region, a floating gate, and a control gate. The memory cell has a threshold voltage selectively configurable into one of at least three programming states. The method comprises generating a drain current between the drain region and the source region by applying a drain-to-source bias voltage between the drain region and the source region. The method further comprises injecting hot electrons from the drain current to the floating gate by applying a gate voltage to the control gate. The gate voltage is ramped from an initial magnitude to a final magnitude greater than the initial magnitude, and the gate voltage is ramped with a ramping rate. A selected threshold voltage for the memory cell corresponding to a selected one of the programming states is generated by applying a gate voltage with a selected final magnitude.

In accordance with yet another aspect of the present invention, a method is provided for programming a memory cell of an electrically erasable programmable read only memory. The method comprises selectively configuring the memory cell into one of at least three programming states without a verification step.

DETAILED DESCRIPTION OF THE PREFERRED EMBODIMENT

Figure 1:
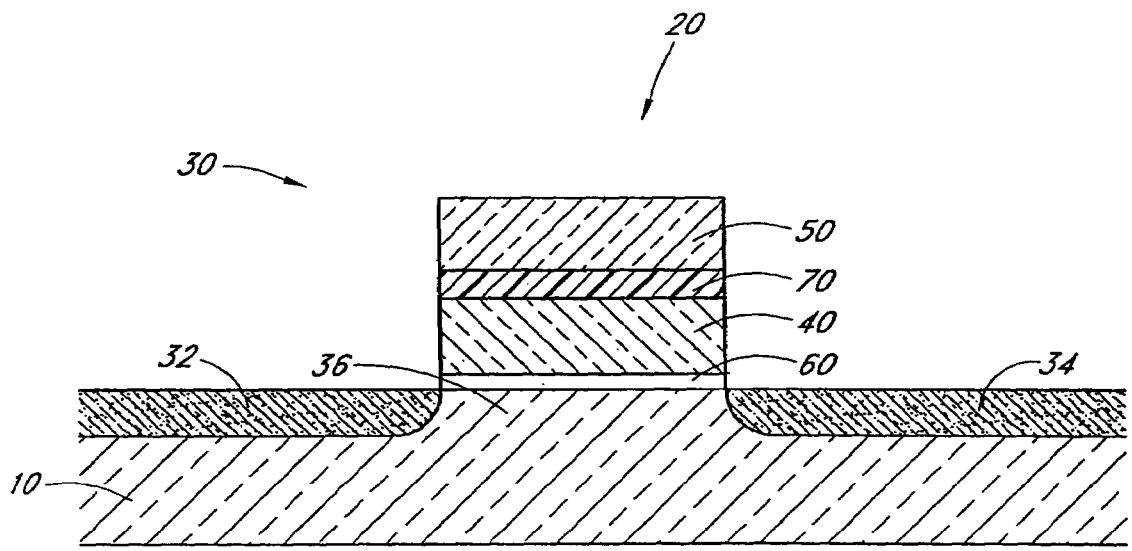
FIG. 1 schematically illustrates a semiconductor substrate with a memory cell compatible with the present invention.

FIG. 1 schematically illustrates a semiconductor substrate 10 with a memory cell 20 compatible with the present invention. The memory cell 20 includes a transistor 30, a floating gate 40, and a control gate 50 above the floating gate 40 in a stacked gate structure. The transistor 30 comprises a source region 32, a drain region 34, and a channel 36 between the source region 32 and the drain region 34. The floating gate 40, typically composed of polycrystalline silicon (i.e., "polysilicon"), is electrically isolated from the underlying semiconductor substrate 10 by a tunnel dielectric layer 60, which is a thin dielectric layer, typically formed of an insulating oxide, and more particularly, silicon oxide, and is typically approximately 100 Å thick. The control gate 50 is positioned above the floating gate 40, and is electrically isolated from the floating gate 40 by a storage dielectric layer 70, such as oxide-nitride-oxide (ONO). Electrical access to the floating gate 40 is therefore only through capacitors. It should be noted that the materials mentioned herein are merely exemplary.

Figure 2:
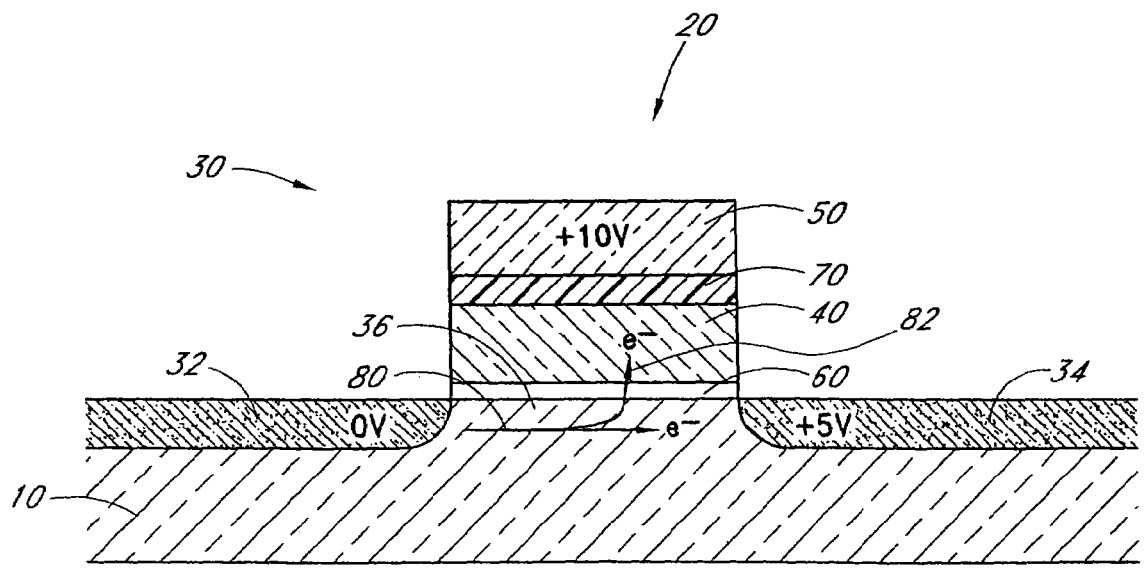
FIG. 2 schematically illustrates channel hot-electron (CHE) injection as a method of charge transfer to the floating gate.

An array of memory cells can be programmed by transferring charge from the semiconductor substrate to the floating gates of selected memory cells. One method of achieving this charge transfer is via channel hot-electron (CHE) injection, which is a three-terminal process, schematically illustrated by FIG. 2. CHE injection utilizes a high positive voltage (e.g., approximately 10 V) applied to the control gate 50, grounding the source region 32 of the transistor 30, and applying a high positive voltage (e.g., approximately 5 V) to the drain region 34 of the transistor 30, thereby creating a high drain-to-source bias voltage (e.g., approximately 5 V). An inversion region is created in the channel 36 between the source 32 and drain 34 regions by the gate voltage, and electrons 80 are accelerated from the source region 32 to the drain region 34 by the drain-to-source bias voltage, thereby creating a drain current between the source region 32 and drain region 34. Some fraction 82 of the electrons 80 will have sufficient energy to surmount the barrier height of the tunnel dielectric 60 and reach the floating gate 40, thereby charging the floating gate 40. By collecting and storing a sufficient amount of charge on the floating gate 40, the $V_T$ of the transistor 30 is increased to be above a predetermined level corresponding to a programmed binary state (e.g., "0"). A memory cell 20 with no charge on its floating gate 40, and with a correspondingly lower $V_T$, is in a non-programmed state (e.g., "1").

Figure 3:
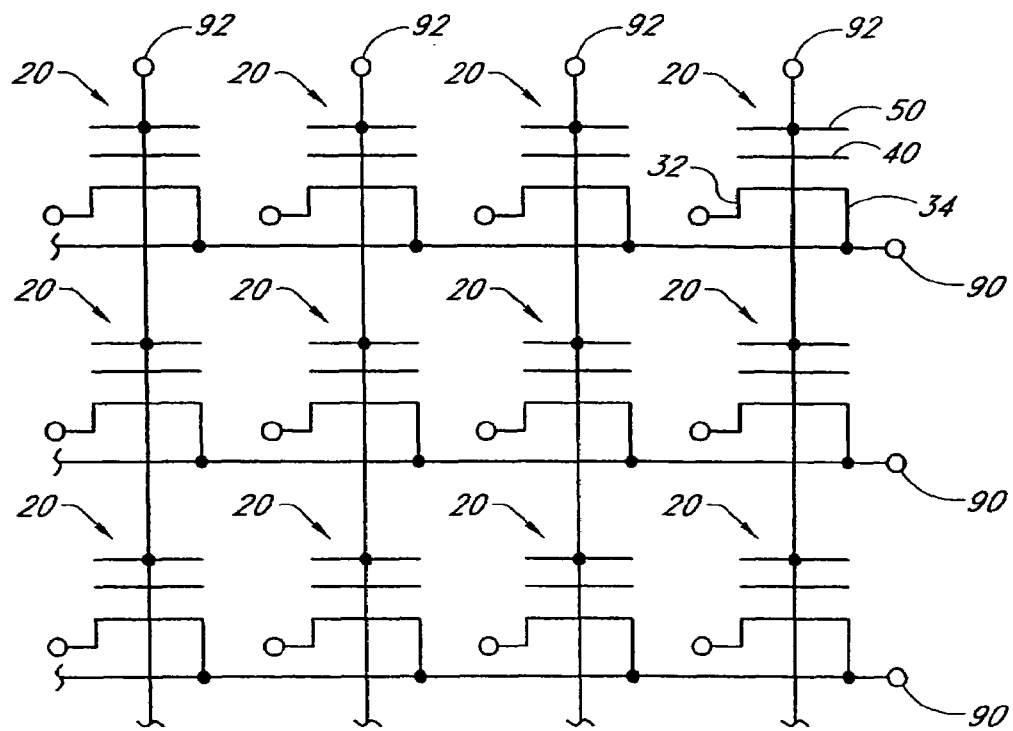
FIG. 3 schematically illustrates an array of NOR-type flash memories.

CHE programming is typically used to program NOR-type flash memories, as schematically illustrated in FIG. 3. In NOR-type flash memories, the memory cells 20 are connected in parallel with the drain region 34 of each memory cell 20 connected to a respective bit-line 90 and with the source region 32 of each memory cell connected to a common source line (not shown). A select line 92 connects the control gates 50 of a column of memory cells 20, one on each bit-line 90, allowing several memory cells 20, such as a byte or a word, to be accessed in parallel. While NOR-type flash memories provide fast random access, its parallel structure reduces its memory density.

Figure 4:
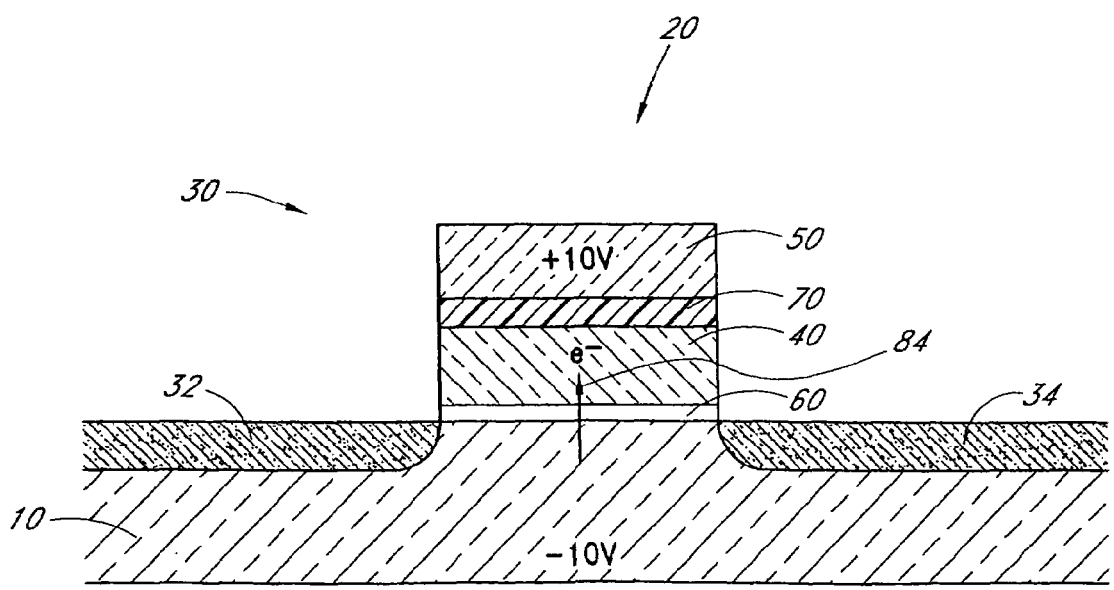
FIG. 4 schematically illustrates Fowler-Nordheim (FN) tunneling as a method of charge transfer to the floating gate.

Another method of storing charge on the floating gate 40 is via Fowler-Nordheim (FN) tunneling, schematically illustrated in FIG. 4, which is a two-terminal process and does not utilize a drain current 80 between the source 32 and drain 34 regions of the transistor 20. By applying a high positive voltage (e.g., approximately 10 V) to the control gate 50, a high negative voltage (e.g., approximately −10 V) to the p-well substrate 10 containing the flash memory cell 20, and floating the source 32 and drain 34 regions, an electric field is created which is sufficient for electrons 84 to tunnel through the tunnel dielectric 60 from the p-well substrate 10 and to enter the floating gate 40, thereby programming the memory cell 20. FN tunneling can occur in any two terminal device (such as a capacitor) and does not require a drain-to-source bias voltage. Compared to CHE programming, FN programming requires higher voltages and has slower programming speeds (typically requiring greater than 1 ms to program as compared to a few μs for CHE programming). However, the lower current densities of FN programming make it easier to use as a method of programming many flash memory cells at the same time (i.e., in parallel).

Figure 5:
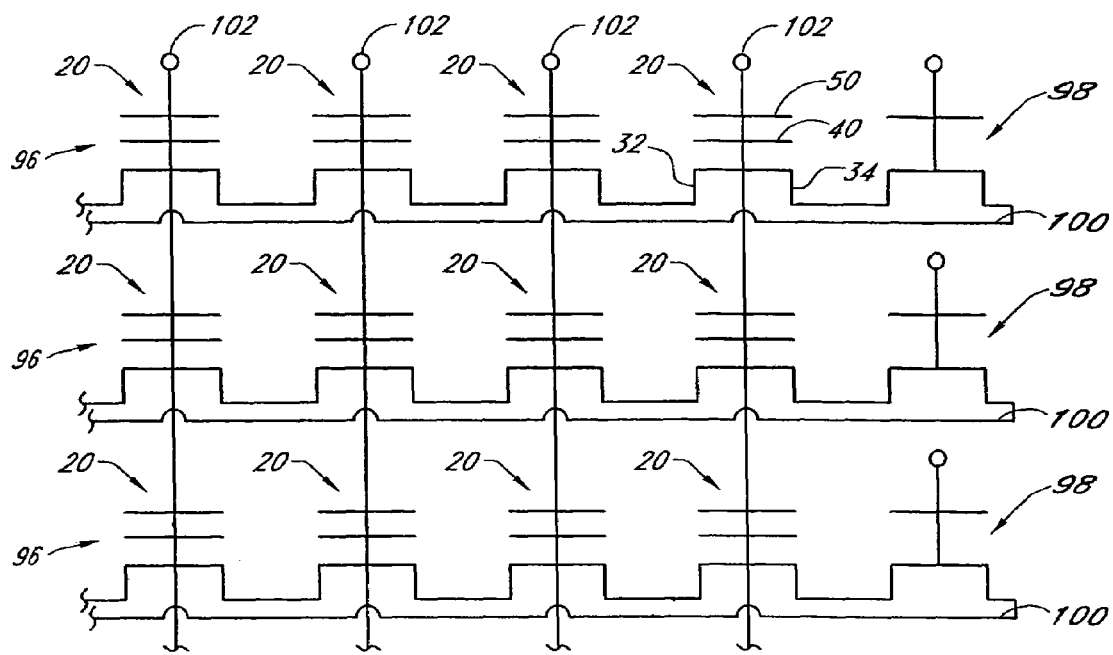
FIG. 5 schematically illustrates an array of NAND-type flash memories.

FN tunneling is typically used to program NAND-type flash memories, as schematically illustrated in FIG. 5. In NAND-type flash memories, the memory cells 20 are connected serially to form strings 96 of memory cells 20, with each string 96 having a string select gate 98 at one end which connects the string 96 to a bit-line 100 and a ground select gate at the opposite end of the string which connects the string to ground (not shown). A select line 102 connects the control gates 50 of a column of memory cells 20, one on each string 96. Because no outside contact is needed within a string 96 of memory cells 20, NAND-type flash memories provide increased memory density. However, because selected memory cells 20 must be accessed through the other unselected memory cells 20 of the string 96, the reading speed is limited.

As described above, the traditional programming method for multilevel memory cells has been to program the memory cell using short programming pulses of the control gate voltage and drain voltage. To achieve the narrow $V_T$ distributions, the short programming pulses are typically interleaved with verification read pulses in order to closely monitor the programmed level of a given cell. The short programming pulses and frequent verification steps make the program operation very time consuming.

In addition, use of CHE injection to program flash EPROM devices has the disadvantage of requiring rather high drain currents in order to generate the charge which is stored on the floating gate 40. Because the total current available to program the memory cells is limited at any one time, the high drain currents constrain the number of memory cells 20 which can be programmed in parallel to typically a few hundred cells maximum. One way to reduce the peak programming current, as disclosed by Keeney, et al. in U.S. Pat. Nos. 5,553,020 and 5,487,033, is to step the gate voltage of the memory cell 20 as it is being programmed, in increments from an initial minimum value to a maximum value based upon the number of levels to program in the memory cell 20. Each step of the gate voltage is accompanied by a corresponding pulse of the drain voltage and a verifying pulse until the desired threshold voltage is reached on the floating gate. In this way, the drain current can be reduced; however, there is a corresponding increase in the time required to charge the floating gate 40 to a given level.

Similarly, while use of FN tunneling to program flash EPROM devices does not utilize drain current, stepping up the gate voltage of the memory cell 20 as it is being programmed reduces the tunneling current and significantly increases the time required to program the memory cell 20. The programming current can be further reduced by applying a reverse back bias between the substrate 10 and the control gate 50 to increase the gate current efficiency, as is described by Hu, et al., in "Substrate-Current-Induced Hot Electron (SCIHE) Injection: A New Convergence Scheme For Flash Memory," IEDM Tech. Dig., pp. 283–286, 1995, which is incorporated by reference herein.

Figure 6:
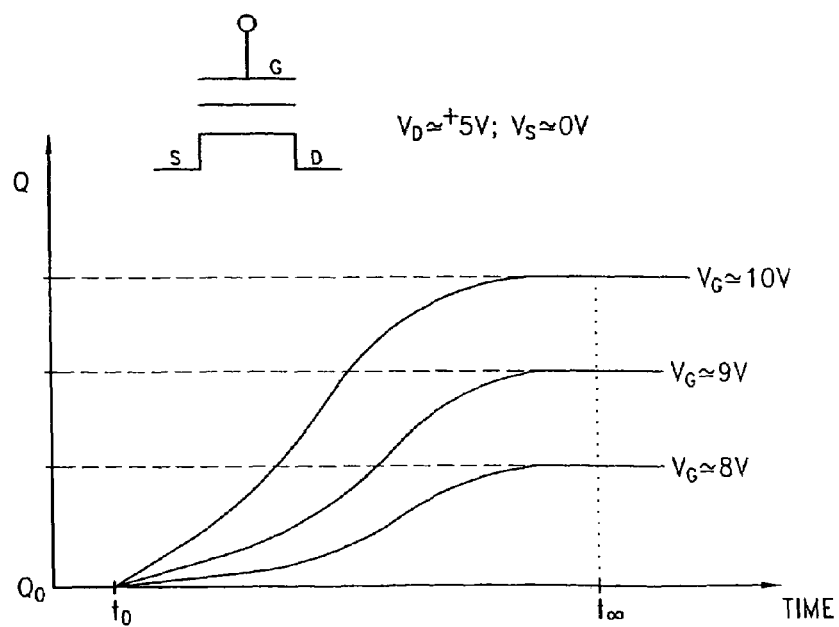
FIG. 6 schematically illustrates the variation of floating gate charge as a function of time upon applying voltages corresponding to CHE injection to the memory cell.

The charge Q applied to the floating gate 40 varies with time during the charging from an initial value of $Q_0$ (equal to zero prior to applying the voltages corresponding to CHE injection at $t_0$) to a saturation value $Q_1$ at a later time $t_\infty$. FIG. 6 schematically illustrates the variation of floating gate charge Q as a function of time upon applying voltages corresponding to CHE injection to the memory cell 20. As more charge is built up in the floating gate 40, the electric field which attracts the hot electrons in the channel 36 toward the floating gate 40 is lessened. Once the floating gate 40 has the saturation charge $Q_1$, the hot electrons in the channel 36 are shielded from the gate voltage $V_G$ and no more hot electrons reach the floating gate 40. The amount of saturation charge $Q_1$ is dependent on the gate voltage $V_G$, as is apparent from FIG. 6, which shows three different saturation charge levels for three different gate voltages. The time to reach the saturation charge $Q_1$ does not exhibit a large dependency on the gate voltage $V_G$, but it is typically between approximately 100 ns and 10 μs. The threshold voltage $V_T$ is dependent on the amount of charge applied to the floating gate 40.

Figure 7A:
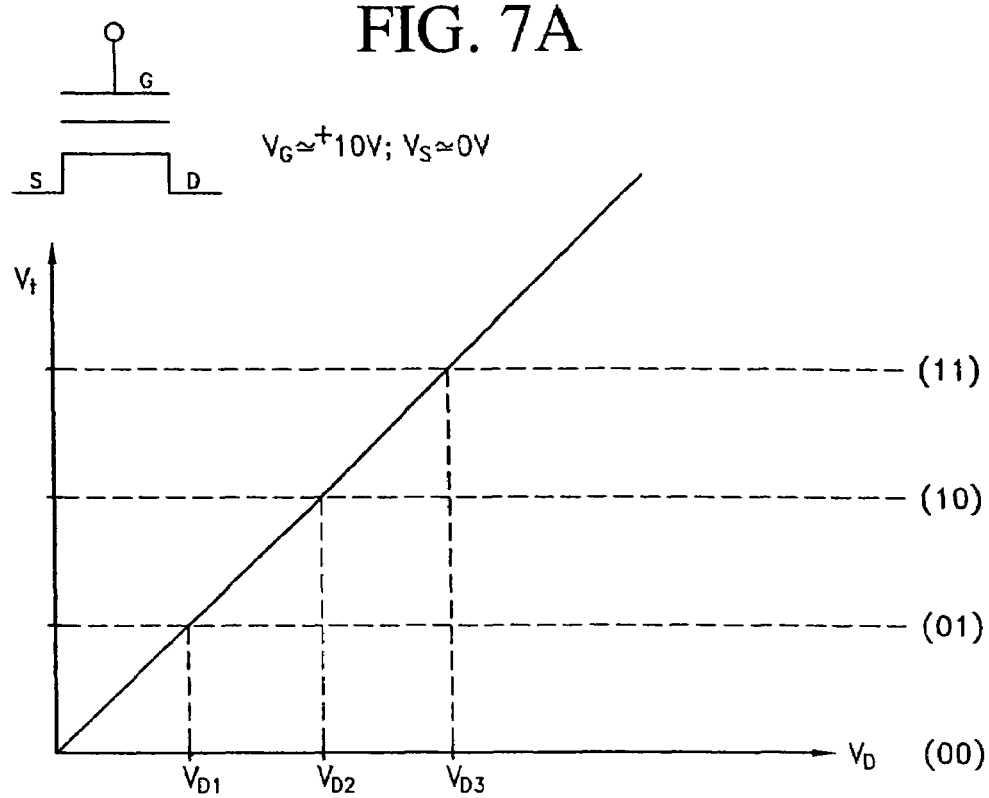
FIG. 7A schematically illustrates the multilevel states achieved by using different drain voltages during the CHE injection operation.

In certain embodiments of the present invention, the memory cell 20 is programmed using CHE injection by applying a constant drain-to-source bias voltage between the drain region 34 and source region 32 and a gate voltage to the control gate 50 without verification read pulses. Selected threshold voltages for the memory cell 20 corresponding to a selected one of the multilevel programming states are generated by applying different selected drain-to-source bias voltages during the CHE injection operation. In one such embodiment, schematically illustrated in FIG. 7A, each cell has two bits, and hence four states: (00), (01), (10), and (11). In certain embodiments, one of the four states (e.g., (00)) corresponds to the cell after erase. The magnitude of the drain voltage $V_D$ is selected to provide a selected threshold voltage corresponding to one of the three other possible states: (01), (10), and (11), with the gate voltage $V_G$ and the source voltage $V_S$ set at constant values (e.g., $V_G$ is set to approximately +10 V, $V_S$ is set to approximately 0 V). The amount of charge injected onto the floating gate 40 corresponds to the potential difference between the source region 32 and the drain region 34, i.e., the drain-to-source bias voltage. For example, referring to FIG. 7A, to apply a charge to the floating gate 40 of a memory cell 20 so that the threshold voltage corresponds to a (01) state, the drain voltage $V_D$ is set to a voltage substantially equal to $V_{D1}$. Similarly, the (10) state is achieved by applying a drain voltage that is substantially equal to $V_{D2}$, and the (11) state is achieved by applying a drain voltage that is substantially equal to $V_{D3}$.

Figure 7B:
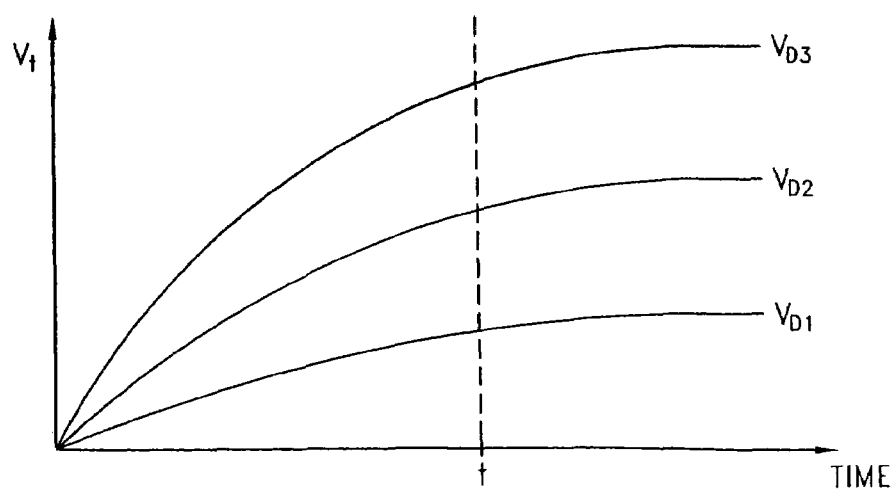
FIG. 7B schematically illustrates the threshold voltage achieved as a function of time by applying different drain voltages during the CHE injection operation.

Referring to FIG. 7B, various values of the drain voltage $V_D$ (e.g., $V_{D1}$=4 V; $V_{D2}$=5 V; $V_{D3}$=6V) produce different threshold voltages $V_t$ after a fixed program time. By halting the programming of a cell after a fixed time, embodiments of the present invention achieve selected multilevel programming states while avoiding the verification steps of the prior art.

Figure 8:
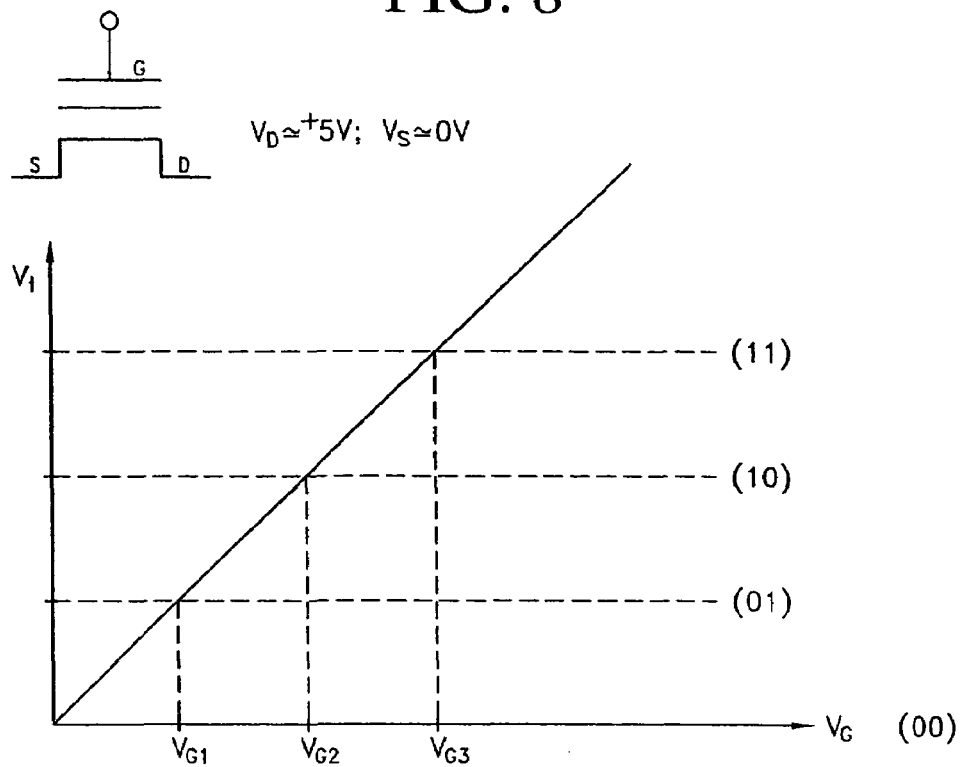
FIG. 8 schematically illustrates the multilevel states achieved by using different gate voltages during the CHE injection operation.

In other embodiments of the present invention, selected threshold voltages corresponding to selected multilevel programming states are generated by applying different gate voltages during the CHE injection operation. As schematically illustrated in FIG. 8, the memory cell 20 is programmed using CHE injection by setting the drain voltage and the source voltage to constant values (e.g., $V_D$ of approximately +5 V and $V_S$ of approximately 0 V). The magnitude of the gate voltage $V_G$ is selected to provide a selected threshold voltage corresponding to one of the four possible multilevel states. The amount of charge injected onto the floating gate 40 corresponds to the gate voltage. For example, referring to FIG. 8, to apply a charge to the floating gate 40 of a memory cell 20 so that the threshold voltage corresponds to a (01) state, the gate voltage $V_G$ is set to a voltage substantially equal to $V_{G1}$ (e.g., $V_{G1}$=6 V). Similarly, the (10) state is achieved by applying a gate voltage substantially equal to $V_{G2}$ (e.g., $V_{G2}$=8 V), and the (11) state is achieved by applying a gate voltage substantially equal to $V_{G3}$ (e.g., $V_{G3}$=10 V).

Figure 9:
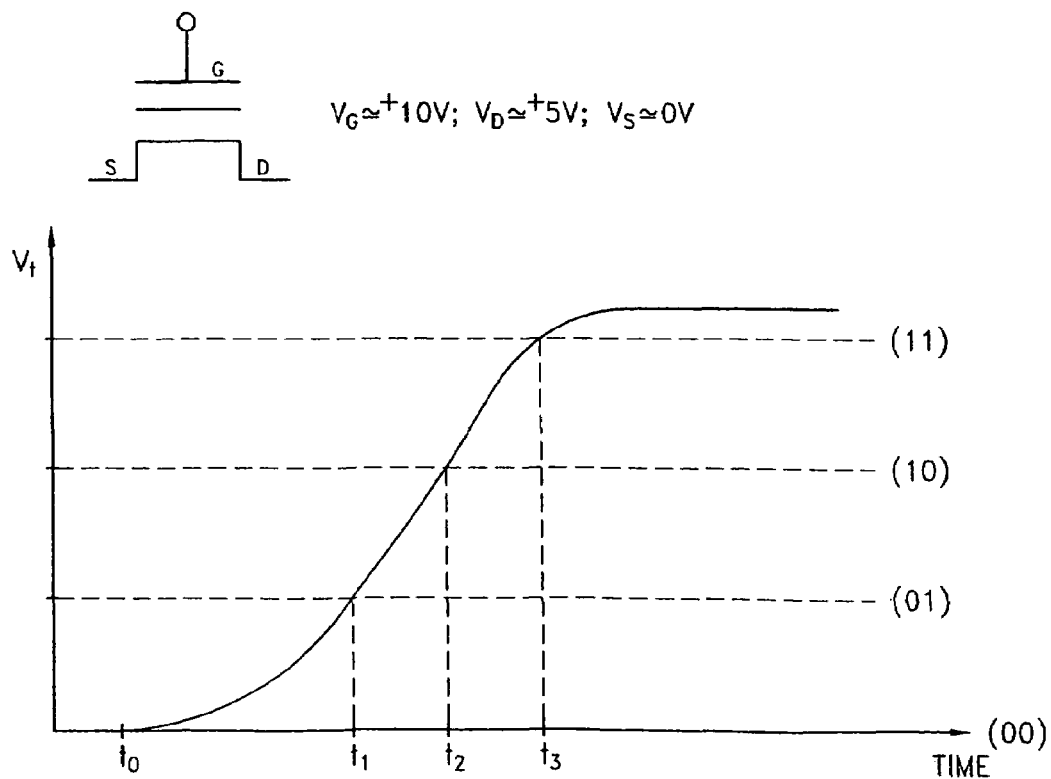
FIG. 9 schematically illustrates the multilevel states achieved by using different pulse widths on the voltages during the CHE injection operation.

In still other embodiments of the present invention, the time profile of the applied voltages, as schematically illustrated in FIG. 9, is utilized to set the threshold voltage to one of the four possible states. A selected threshold voltage corresponding to a selected multilevel programming state is generated by applying voltages comprising at least one voltage pulse, with a selected pulse period during the CHE injection operation. For example, referring to FIG. 9, to apply a charge to the floating gate 40 of a memory cell 20 so that the threshold voltage corresponds to a (01) state, a single gate voltage pulse $V_G$ with a magnitude of approximately 10 V and a period of approximately $(t_1-t_0)$ is applied to the control gate 50 while the source voltage and drain voltage are set at constant values (e.g., $V_S$ of approximately 0 V, $V_D$ of approximately 5 V). Similarly, the (10) state is achieved by applying a voltage pulse with a period approximately equal to $(t_2-t_0)$, and the (11) state is achieved by applying a voltage pulse with a period approximately equal to $(t_3-t_0)$. In certain embodiments, the total time in which the appropriate voltages for CHE injection are applied to the memory cell 20 are distributed among a plurality of pulses (i.e., the sum of the pulse periods of the plurality of pulses has the required time duration to achieve the desired state of the memory cell 20). The voltage pulse of the gate voltage $V_G$ preferably has a period of between approximately 1 ns and approximately 10 μs. For example, $V_G$ can be applied for 2 ns to program the (01) state, 0.1 μs to program the (10) state, and 2 μs to program the (11) state.

Alternatively, in other embodiments, the drain voltage $V_D$ can be pulsed and the gate voltage $V_G$ selected to generate a selected threshold voltage corresponding to a selected multilevel programming state. For example, $V_D$ can be applied for 2 ns to program the (01) state, 0.1 μs to program the (10) state, and 2 μs to program the (11) state. The voltage pulse of the drain voltage $V_D$ preferably has a period of between approximately 1 ns and approximately 10 μs. Alternatively, in still other embodiments, the drain voltage $V_D$ can be pulsed, the source voltage $V_S$ can be pulsed, or any combination of the gate voltage $V_G$, drain voltage $V_D$, and source voltage $V_S$ can be pulsed to set the threshold voltage to one of the four possible states.

Figure 10:
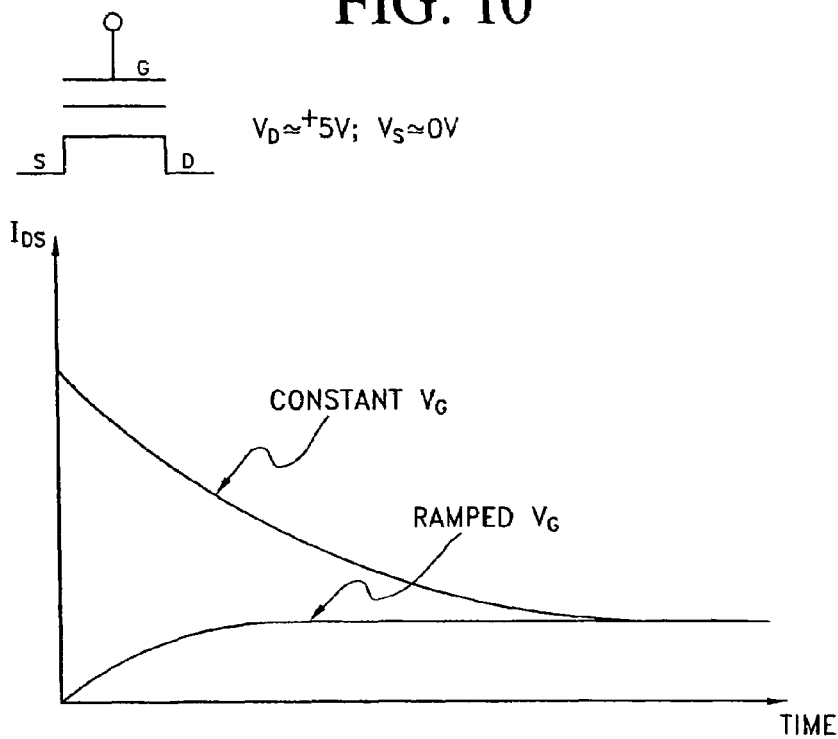
FIG. 10 schematically illustrates the variation of the drain current as a function of time upon applying a ramped gate voltage as compared to a constant gate voltage.

In still other embodiments of the present invention, selected threshold voltages corresponding to selected multilevel programming states are generated by ramping the voltages applied to the memory cell 20 during the CHE injection operation without applying verification pulses. As described above, as charge accumulates in the floating gate 40, the hot electrons in the channel 36 are increasingly shielded from the gate voltage $V_G$, thereby reducing the rate of charge injection and eventually reaching a saturation level corresponding to a saturation threshold voltage. When applying a constant gate voltage $V_G$, as schematically illustrated in FIG. 10, there will be a high drain current at the beginning of the programming, due to the large potential difference between the floating gate 40 and the channel 36. By ramping the gate voltage $V_G$ during the CHE injection from an initial magnitude to a final magnitude greater than the initial magnitude, the drain current will be constant over an extended period of time, at a lower level, as schematically illustrated in FIG. 10. The saturation threshold will be determined by both the drain voltage, and the final gate voltage at the end of the ramp.

In certain embodiments, a ramped gate voltage $V_G$ is used with different values of the drain voltage $V_D$, the values of the applied drain voltage $V_D$ selected to generate selected threshold voltages for the memory cell 20 corresponding to selected multilevel programming states. Such embodiments are similar to those discussed in relation to FIG. 7, but with lessened drain currents due to the ramping of the gate voltage $V_G$, so that a large number of cells can be programmed in parallel. In certain other embodiments, a ramped gate voltage $V_G$ is used with different pulse periods of the drain voltage $V_D$, the pulse periods selected to generate selected threshold voltages corresponding to selected multilevel programming states of the memory cell 20. Such embodiments are similar to those discussed in relation to FIG. 9, but with lessened drain currents due to the ramping of the gate voltage $V_G$, so that a large number of cells can be programmed in parallel. In still other embodiments, the value of the final gate voltage $V_G$ during the ramping is selected to generate selected threshold voltages corresponding to selected multilevel programming states of the memory cell 20. Such embodiments are similar to those discussed in relation to FIG. 8, but with lessened drain currents due to the ramping of the gate voltage $V_G$, and again a large number of cells can be programmed at the same time. For example, 7 V, 9 V, and 11 V can be used as the final gate voltage for programmed states (01), (10), and (11), respectively.

Figure 11:
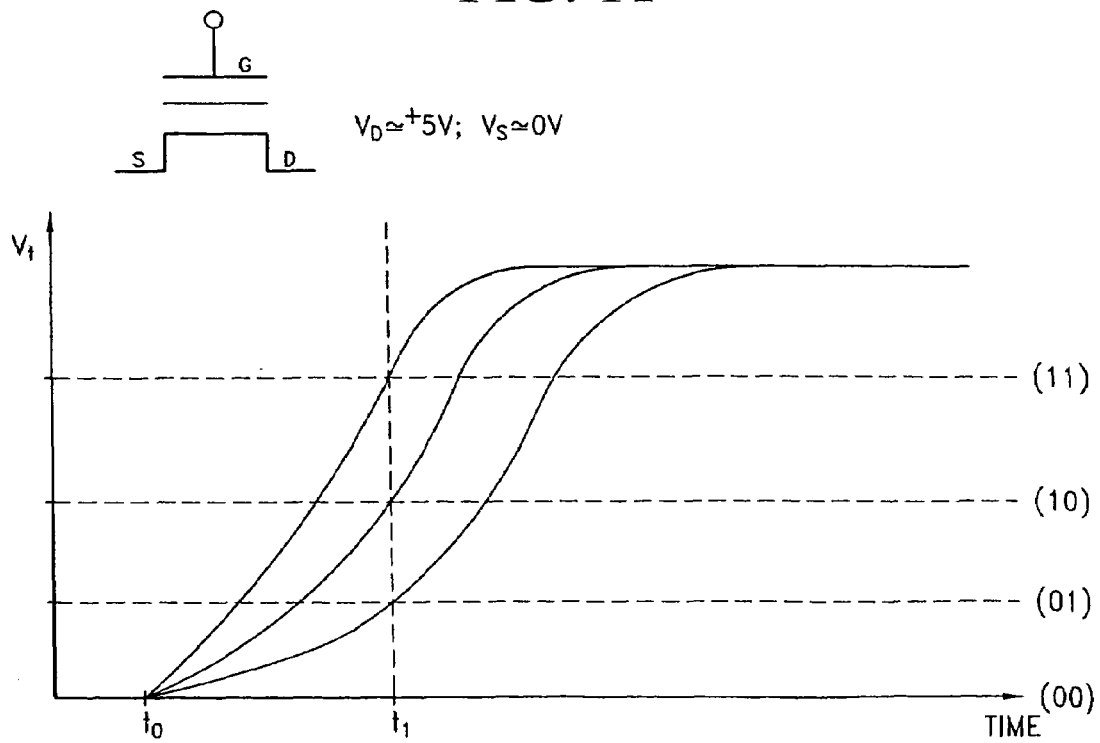
FIG. 11 schematically illustrates the multilevel states achieved by using different ramping rates on the gate voltage.

As schematically illustrated in FIG. 11, by selecting the rate of ramping of the gate voltage $V_G$, selected threshold voltages corresponding to selected multilevel programming states of the memory cell 20 can be generated. The amount of charge on the floating gate 40 after CHE injection for a time $(t_1-t_0)$ is dependent on the ramping rate of the gate voltage $V_G$. Slower ramping rates correspond to slower charge injection on the floating gate 40, and less charge on the floating gate 40 after a known time $(t_1-t_0)$. Therefore, the ramping rate of $V_G$ can be selected to yield a particular amount of charge on the floating gate 40 after a known charging time, thereby setting the threshold voltage to one of the four possible states. For example, within 1 ms, the gate voltage can be ramped from 0 V to 6 V, 8 V, and 10 V for programmed states (01), (10), and (11), respectively. In certain embodiments, the injection of charge is performed for the known time $(t_1-t_0)$ by pulsing the voltages applied to the memory cell 20 (e.g., pulsing the drain voltage $V_D$, the source voltage $V_S$, the gate voltage $V_G$, or any combination of the gate voltage $V_G$, drain voltage $V_D$, and source voltage $V_S$).

In certain other embodiments, where the drain voltage does not have a constant magnitude, the drain region 34 can be connected to a constant current source. In this way, the drain current is maintained to have a substantially constant magnitude throughout the charging operation. The amount of charge injected onto the floating gate 40 varies with the amount of drain current, so multilevel states are generated by using different drain currents during the CHE injection operation. Such a constant drain current can be utilized with any of the above-described embodiments.

In still other embodiments, a reverse back bias can be applied between the substrate 10 and control gate 50 to increase the fraction of hot electrons which are injected from the channel 36 to the floating gate 40. When combined with the above-described embodiments, the reverse back bias improves the programming efficiency and yields faster convergence to the desired saturation threshold voltage. Values of the back bias compatible with embodiments of the present invention range from approximately 0 V to approximately −4 V.

Figure 12:
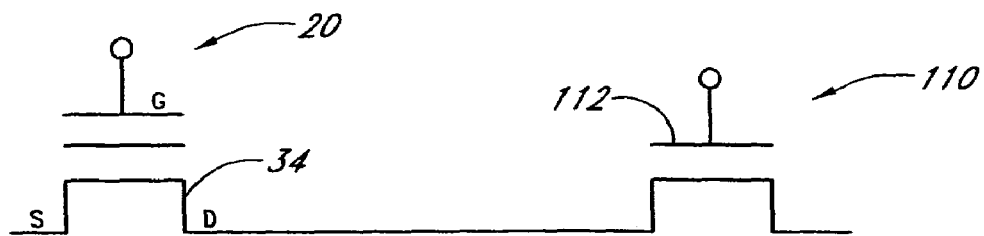
FIG. 12 schematically illustrates the drain region of a memory cell connected to a transistor.

Different voltages on the drain region 34 can be achieved by connecting a transistor 110 in series between the drain region 34 of the memory cell 20 and a drain voltage generator (not shown). For example, as schematically illustrated in FIG. 12, a transistor 110 is connected on a bit line in series to the drain region 34, the transistor 110 having a transistor control gate 112. Multilevel states are achieved by using different control voltages on the transistor control gate 112 during the programming operation to adjust a voltage applied to the drain region 34 of the memory cell 20. Such a transistor 110 can be utilized with any of the above-described embodiments.

Figure 13:
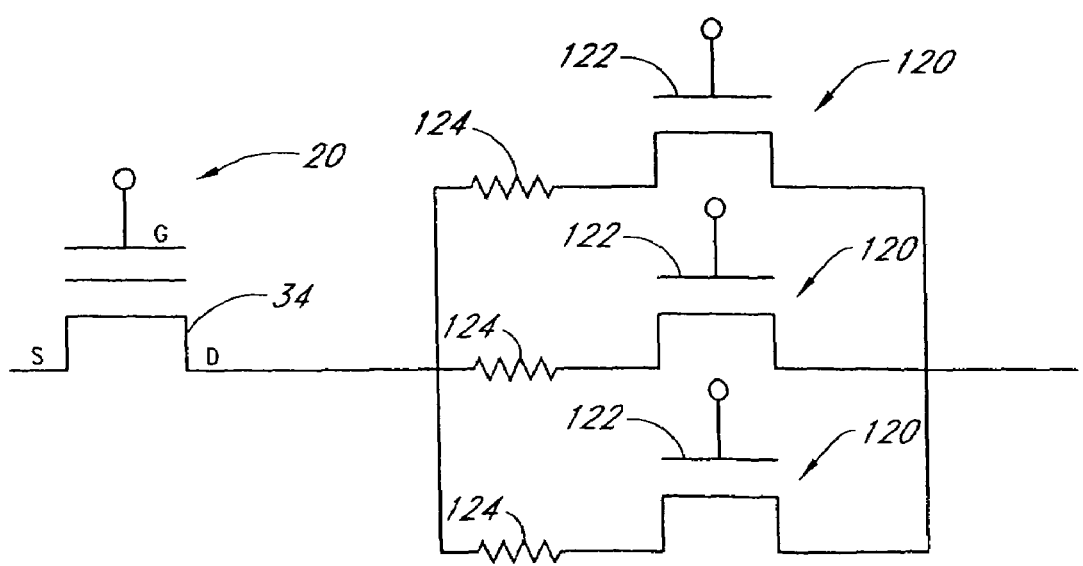
FIG. 13 schematically illustrates the drain region of a memory cell connected to a plurality of pairs of transistors and resistors, the pairs connected in parallel.

In alternative embodiments, as schematically illustrated in FIG. 13, a plurality of pairs of transistors 120 and resistors 124, in which each transistor 120 has a transistor control gate 122 and is in series with a corresponding resistor 124, are connected in parallel between the drain region 34 of the memory cell 20 and a drain voltage generator (not shown). The resistors 124 each have a different resistance, and multilevel states are achieved by selectively applying a control voltage to at least one transistor 120, thereby applying different voltages to the drain region 34 during the programming operation. Such a plurality of pairs of transistors 120 and resistors 122 can be utilized with any of the above-described embodiments.

In the embodiments described above, the memory cells are initially discharged or erased, and the appropriate amount of charge is applied to the floating gate 40 to correspond to one of the multilevel programming states. In still other embodiments compatible with the present invention, the memory cells are initially charged to a selected value, and then discharged by a selected amount, resulting in the appropriate amount of charge on the floating gate 40 to correspond to one of the multilevel programming states.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

We claim:

1. A method for programming a memory cell of an electrically erasable programmable read only memory, the memory cell fabricated on a substrate and comprising a source region, a drain region, a floating gate, and a control gate, the memory cell having a threshold voltage selectively configurable into one of at least three programming states, the method comprising:
   generating a drain current between the drain region and the source region by applying a drain-to-source bias voltage between the drain region and the source region; and
   generating a selected threshold voltage for the memory cell corresponding to a selected one of the programming states by injecting hot electrons from the drain current to the floating gate by applying a gate voltage to the control gate, the gate voltage being ramped from an initial magnitude to a final magnitude greater than the initial magnitude, the gate voltage ramped with a ramping rate, whereby the selected threshold voltage for each programming state is generated by applying a gate voltage with a different final magnitude, wherein the ramping rate is between approximately 5.5 V/ms and approximately 10.5 V/ms.

2. The method of claim 1, wherein the final magnitude is between approximately 5.5 V and approximately 10.5 V.

3. The method of claim 1, wherein the drain-to-source bias voltage is substantially constant.

4. The method of claim 1, wherein the drain-to-source bias voltage comprises at least one voltage pulse having a period.

5. The method of claim 4, wherein the period is between approximately 1 nanosecond and approximately 10 microseconds.

6. The method of claim 1, wherein the drain-to-source bias voltage is approximately 5 volts.

7. The method of claim 1, wherein a transistor comprising a control gate is connected in series between the drain region of the memory cell and a drain voltage generator, whereby a control voltage applied to the control gate of the transistor adjusts a voltage applied to the drain region of the memory cell.

8. A method for programming a memory cell of an electrically erasable programmable read only memory, the memory cell fabricated on a substrate and comprising a source region, a drain region, a floating gate, and a control gate, the memory cell having a threshold voltage selectively configurable into one of at least three programming states, the method comprising:

generating a drain current between the drain region and the source region by applying a drain-to-source bias voltage between the drain region and the source region; and generating a selected threshold voltage for the memory cell corresponding to a selected one of the programming states by injecting hot electrons from the drain current to the floating gate by applying a gate voltage to the control gate, the gate voltage being ramped from an initial magnitude to a final magnitude greater than the initial magnitude, the gate voltage ramped with a ramping rate, whereby the selected threshold voltage for each programming state is generated by applying a gate voltage with a different final magnitude, wherein a plurality of circuit segments are connected in parallel between the drain region of the memory cell and a drain voltage generator, each circuit segment comprising a resistor connected in series with a transistor having a control gate, whereby selectively applying a control voltage the control gate of to at least one transistor adjusts a voltage applied to the drain region of the memory cell.

9. The method of claim 1, wherein the drain-to-source bias voltage is selected to maintain a drain current having a substantially constant magnitude.

10. The method of claim 1, wherein a reverse back bias is applied between the substrate and the control gate.

11. A method of selecting a threshold voltage corresponding to one of at least three programming states of a memory cell of an electrically erasable programmable read only memory, the memory cell fabricated on a substrate and comprising a source region, a drain region, a floating gate, and a control gate, the method comprising:

generating a drain current between the drain region and the source region by applying a drain-to-source bias voltage between the drain region and the source region; and generating a selected threshold voltage for the memory cell corresponding to a selected one of the programming states by injecting hot electrons from the drain current to the floating gate by applying a gate voltage to the control gate, the gate voltage being ramped from an initial magnitude to a final magnitude greater than the initial magnitude, the gate voltage ramped with a ramping rate, whereby the selected threshold voltage for each programming state is generated by applying a gate voltage with a different final magnitude, wherein the ramping rate is between approximately 5.5 V/ms and approximately 10.5 V/ms.

12. The method of claim 11, wherein the final magnitude is between approximately 5.5 V and approximately 10.5 V.

13. The method of claim 11, wherein the drain-to-source bias voltage is substantially constant.

14. The method of claim 11, wherein the drain-to-source bias voltage comprises at least one voltage pulse having a period.

15. The method of claim 14, wherein the period is between approximately 1 nanosecond and approximately 10 microseconds.

16. The method of claim 11, wherein the drain-to-source bias voltage is approximately 5 volts.

* * * * *